(12) United States Patent
Kobayakawa et al.

(10) Patent No.: US 10,861,778 B2
(45) Date of Patent: Dec. 8, 2020

(54) SEMICONDUCTOR LIGHT EMITTING DEVICE AND METHOD FOR MANUFACTURING THE SAME

(71) Applicant: ROHM CO., LTD., Kyoto (JP)

(72) Inventors: Masahiko Kobayakawa, Kyoto (JP); Kazuhiro Mireba, Kyoto (JP); Shintaro Yasuda, Kyoto (JP); Junichi Itai, Kyoto (JP); Taisuke Okada, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/562,288

(22) Filed: Sep. 5, 2019

(65) Prior Publication Data

US 2019/0393139 A1 Dec. 26, 2019

Related U.S. Application Data

(60) Continuation of application No. 15/818,202, filed on Nov. 20, 2017, now Pat. No. 10,446,475, which is a (Continued)

(30) Foreign Application Priority Data

Mar. 11, 2008 (JP) .................................. 2008-60781
Sep. 16, 2008 (JP) ................................ 2008-236997
Jan. 9, 2009 (JP) .................................... 2009-3288

(51) Int. Cl.
*H01L 23/495* (2006.01)
*H01L 23/31* (2006.01)
(Continued)

(52) U.S. Cl.
CPC ........ *H01L 23/49548* (2013.01); *H01L 23/31* (2013.01); *H01L 23/48* (2013.01);
(Continued)

(58) Field of Classification Search
CPC ..... H01L 33/48; H01L 33/483; H01L 33/486; H01L 33/52; H01L 33/62; H01L 33/64; H01L 33/642; H01L 33/644; H01L 33/647; H01L 23/29; H01L 23/31; H01L 23/3107; H01L 23/34; H01L 23/36; H01L 23/367;
(Continued)

(56) References Cited

U.S. PATENT DOCUMENTS 5,298,768 A * 3/1994 Okazaki ............... H01L 33/486
257/100
5,521,429 A 5/1996 Aono et al.
(Continued)

FOREIGN PATENT DOCUMENTS

JP 2001-196641 7/2001

*Primary Examiner* — Eduardo A Rodela
(74) *Attorney, Agent, or Firm* — Hamre, Schumann, Mueller & Larson, P.C.

(57) ABSTRACT

A semiconductor light emitting device includes semiconductor light source, a resin package surrounding the semiconductor light source, and a lead fixed to the resin package. The lead is provided with a die bonding pad for bonding the semiconductor light source, and with an exposed surface opposite to the die bonding pad The exposed surface is surrounded by the resin package in the in-plane direction of the exposed surface.

47 Claims, 8 Drawing Sheets

Related U.S. Application Data continuation of application No. 15/457,679, filed on Mar. 13, 2017, now Pat. No. 9,953,901, which is a division of application No. 14/562,998, filed on Dec. 8, 2014, now Pat. No. 9,634,212, which is a continuation of application No. 14/108,922, filed on Dec. 17, 2013, now Pat. No. 8,921,874, which is a continuation of application No. 12/401,852, filed on Mar. 11, 2009, now Pat. No. 8,633,506.

(51) Int. Cl.
```
H01L 23/488      (2006.01)
H01L 33/48       (2010.01)
H01L 33/52       (2010.01)
H01L 25/075      (2006.01)
H01L 33/62       (2010.01)
H01L 33/54       (2010.01)
H01L 23/48       (2006.01)
H01L 33/50       (2010.01)
H01L 33/56       (2010.01)
H01L 33/60       (2010.01)
H01L 33/64       (2010.01)
H01L 25/16       (2006.01)
```

(52) U.S. Cl.
CPC .......... *H01L 23/488* (2013.01); *H01L 23/495* (2013.01); *H01L 23/4951* (2013.01); *H01L 23/49503* (2013.01); *H01L 23/49517* (2013.01); *H01L 23/49541* (2013.01); *H01L 23/49575* (2013.01); *H01L 25/0753* (2013.01); *H01L 33/48* (2013.01); *H01L 33/483* (2013.01); *H01L 33/486* (2013.01); *H01L 33/502* (2013.01); *H01L 33/52* (2013.01); *H01L 33/54* (2013.01); *H01L 33/56* (2013.01); *H01L 33/60* (2013.01); *H01L 33/62* (2013.01); *H01L 33/647* (2013.01); *H01L 25/167* (2013.01); *H01L 2224/48091* (2013.01); *H01L 2224/48247* (2013.01)

(58) Field of Classification Search
CPC ... H01L 23/3677; H01L 23/48; H01L 23/495; H01L 23/49503; H01L 23/4951; H01L 23/49513; H01L 23/49541; H01L 23/49548; H01L 23/49568
See application file for complete search history.

(56) References Cited

U.S. PATENT DOCUMENTS

| | | |
|---|---|---|
| 6,054,716 A | 4/2000 | Sonobe et al. |
| 6,066,861 A | 5/2000 | Hohn et al. |
| 6,437,429 B1 * | 8/2002 | Su .................. H01L 23/3107 257/666 |
| 6,501,156 B1 * | 12/2002 | Nakanishi ......... H01L 23/49503 257/432 |
| 6,580,161 B2 | 6/2003 | Kobayakawa |
| 7,242,032 B2 | 7/2007 | Oshio |
| 7,381,996 B2 * | 6/2008 | Hsin Chen ............ H01L 33/642 257/100 |
| 7,524,087 B1 | 4/2009 | Aizar |
| 7,612,386 B2 | 11/2009 | Ng et al. |
| 7,705,365 B2 | 4/2010 | Kurokawa et al. |
| 7,737,463 B2 | 6/2010 | Lee et al. |
| 7,875,899 B2 | 1/2011 | Yasuda |
| 7,960,744 B2 | 6/2011 | Seo et al. |
| 10,446,475 B2 * | 10/2019 | Kobayakawa ...... H01L 25/0753 |
| 2002/0121683 A1 | 9/2002 | Kelly |
| 2003/0062601 A1 | 4/2003 | Harnden |
| 2004/0159850 A1 * | 8/2004 | Takenaka ................ H01L 24/97 257/98 |
| 2004/0208210 A1 * | 10/2004 | Inoguchi ................ H01L 33/56 372/36 |
| 2004/0245591 A1 | 12/2004 | Wang |
| 2005/0133939 A1 | 6/2005 | Chikugawa et al. |
| 2006/0180925 A1 | 8/2006 | Lee et al. |
| 2006/0208364 A1 | 9/2006 | Wang |
| 2006/0249746 A1 | 11/2006 | Oshio |
| 2007/0262332 A1 * | 11/2007 | Kong ..................... H01L 33/30 257/81 |
| 2008/0041625 A1 | 2/2008 | Cheong |
| 2008/0054284 A1 | 3/2008 | Hussell |
| 2008/0179620 A1 | 7/2008 | Chang |
| 2008/0191328 A1 | 8/2008 | Kobayakawa |
| 2009/0072251 A1 | 3/2009 | Chan |
| 2009/0114932 A1 | 5/2009 | Chou |
| 2010/0155748 A1 | 6/2010 | Chan et al. |
| 2010/0230694 A1 | 9/2010 | Arndt et al. |
| 2010/0276808 A1 | 11/2010 | Kobayakawa et al. |
| 2011/0031865 A1 * | 2/2011 | Hussell ............... H01L 25/0753 313/46 |
| 2011/0108866 A1 * | 5/2011 | Lee ..................... H01L 33/486 257/98 |

\* cited by examiner

SEMICONDUCTOR LIGHT EMITTING DEVICE AND METHOD FOR MANUFACTURING THE SAME

BACKGROUND OF THE INVENTION

1. Field of the Invention

The present invention relates to a semiconductor light emitting device used as e.g. a light source of a cell phone or a pixel light source of a high-definition dot matrix display. The invention also relates to a method for manufacturing such a semiconductor light emitting device.

2. Description of the Related Art

FIG. 13 illustrates an example of conventional semiconductor light emitting device (see JP-A-2001-196641, for example). The semiconductor light emitting device illustrated in the figure includes a substrate 91 formed with a pair of electrodes 92A and 92B, and an LED chip 94 bonded to the substrate 91. The LED chip 94 and the bonding wire 96 are covered with a resin package 95. The electrode 92A is formed with a die bonding pad 92Aa. The LED chip 94 is bonded to the die bonding pad 92Aa using Ag paste 93. The electrode 92B is formed with a bonding pad 92Ba to which the bonding wire 96 is bonded.

In recent years, size reduction of e.g. a cell phone is strongly demanded. Accordingly, there also exists a strong demand for size reduction of a semiconductor light emitting device. In the conventional semiconductor light emitting device X, the enhancement of the brightness of the LED chip 94 involves an increase in the current to flow through the LED chip 94, which increases the heat generated from the LED chip 94. However, since the substrate 91 is generally made of a material such as glass-fiber-reinforced epoxy resin, the thermal conductivity of the substrate 91 is relatively small. Thus, as to the conventional semiconductor light emitting device X, there is still room for improvement for the efficient dissipation of heat from the LED chip 94 and the size reduction of the device.

SUMMARY OF THE INVENTION

The present invention has been proposed under the circumstances described above. It is, therefore, an object of the present invention to provide a semiconductor light emitting device which is capable of achieving size reduction, efficient heat dissipation and high brightness.

According to a first aspect of the present invention, there is provided a semiconductor light emitting device comprising: a semiconductor light source; a resin package surrounding the semiconductor light source; and a lead fixed to the resin package. The lead is provided with a die bonding pad for bonding the semiconductor light source, and with an exposed surface opposite to the die bonding pad and exposed to an outside of the resin package. The exposed surface is surrounded by the resin package in the in-plane direction of the exposed surface.

With this arrangement, the heat from the semiconductor light source efficiently escapes through the lead. Further, the lead can have the smallest size that allows proper mounting of the semiconductor light source. Thus, the size reduction and high brightness of the semiconductor light emitting device can be achieved.

Preferably, the semiconductor light source may comprise a plurality of semiconductor light emitting elements bonded to the die bonding pad.

Preferably, the lead may be formed with a thin portion closer to the die-bonding pad in the thickness direction of the lead.

According to a second aspect of the present invention, there is provided a semiconductor light emitting device comprising: a semiconductor light source; a resin package surrounding the semiconductor light source; and at least one lead fixed to the resin package. The lead includes a thin portion and a thick portion formed integral with the thin portion, where the thin portion and the thick portion include first surfaces flush with each other and second surfaces opposite to the first surfaces. The second surface of the thick portion is exposed to the outside of the resin package, while the second surface of the thin portion is covered by the resin package.

Preferably, the semiconductor light source may be mounted on the first surface of the thin portion.

Preferably, the semiconductor light emitting device of the second aspect may further comprise an additional lead spaced apart from the above-mentioned one lead, where the additional lead comprises a thin portion and a thick portion formed integral with the thin portion. The boundary between the thin portion and the thick portion of the above-mentioned one lead and the boundary between the thin portion and the thick portion of the additional lead are on the same straight line.

Preferably, the thick portion of the above-mentioned one lead may be formed with a projection extending perpendicularly to the thickness direction of the thick portion.

According to a third aspect of the present invention, there is provided a method for manufacturing a semiconductor light emitting device. The method comprises the following steps. First, a lead is formed by pressing a part of a metal plate, so that the resultant lead includes a thin portion and a thick portion integral with the thin portion, where the thin and the thick portions share a flat first surface and have stepped second surfaces opposite to the first surface. Then, a semiconductor light emitting element is mounted on the first surface mentioned above, and a resin package for partially covering the lead is formed in a manner such that the second surface of the thick portion is exposed to the outside of the resin package, and the second surface of the thin portion is covered by the resin package.

Other features and advantages of the present invention will become more apparent from detailed description given below with reference to the accompanying drawings.

DETAILED DESCRIPTION OF THE PREFERRED EMBODIMENTS

Figure 1:
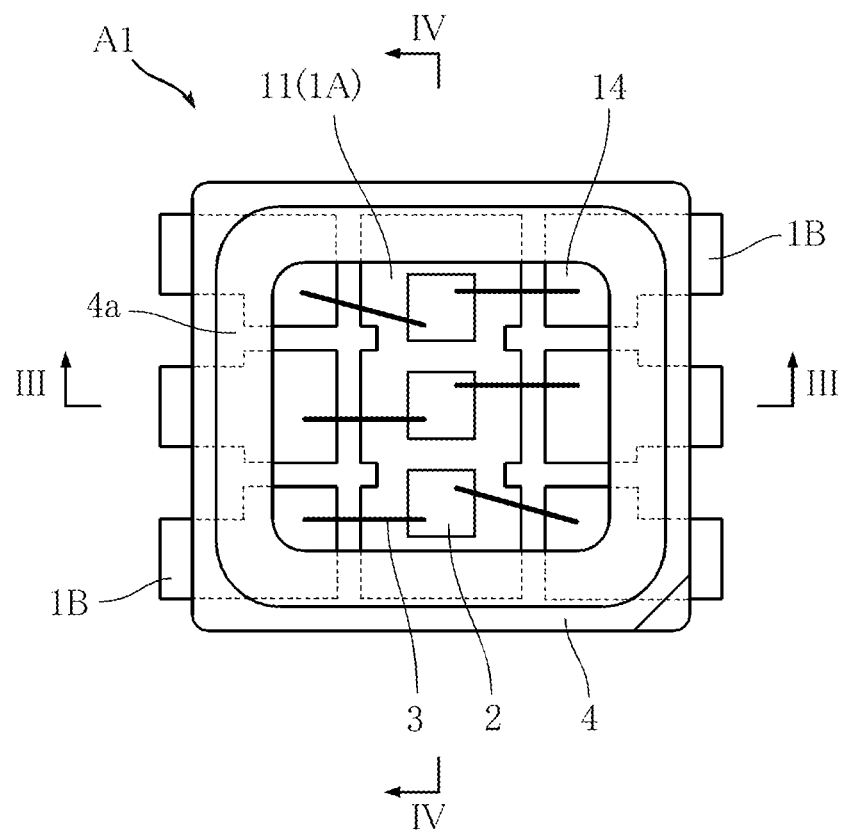
FIG. 1 is a top plan view illustrating a semiconductor light emitting device according to a first embodiment of the present invention.

FIGS. 1-4 illustrate a semiconductor light emitting device according to a first embodiment of the present invention. The semiconductor light emitting device A1 of the first embodiment includes a lead 1A, a plurality of leads 1B, three LED chips 2, a resin package 4 and sealing resin 5. In FIG. 1, the illustration of the sealing resin 5 is omitted for convenience. The semiconductor light emitting device A1 is designed as a very small and thin semiconductor light emitting device having a size of about 3 mm×3 mm in plan view and a thickness of about 0.5 to 0.5 mm.

Figure 2:
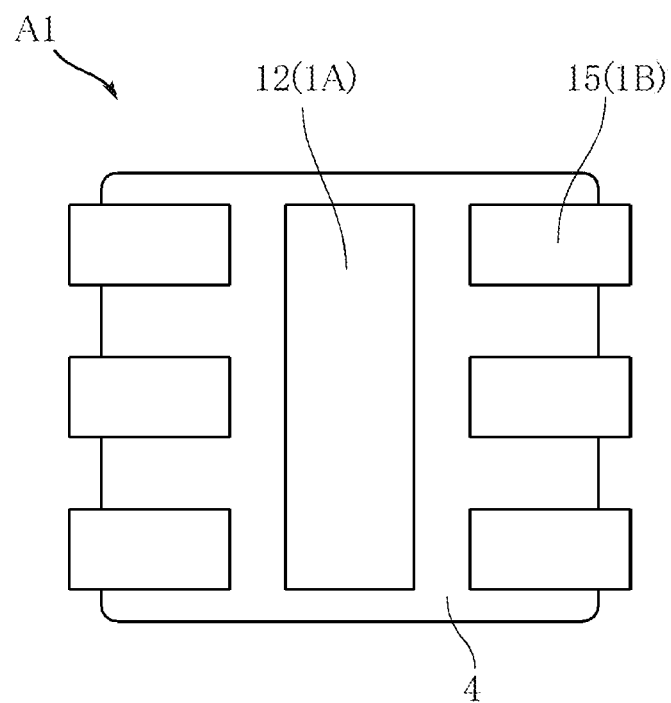
FIG. 2 is a bottom plan view illustrating the semiconductor light emitting device according to the first embodiment of the present invention.
Figure 3:
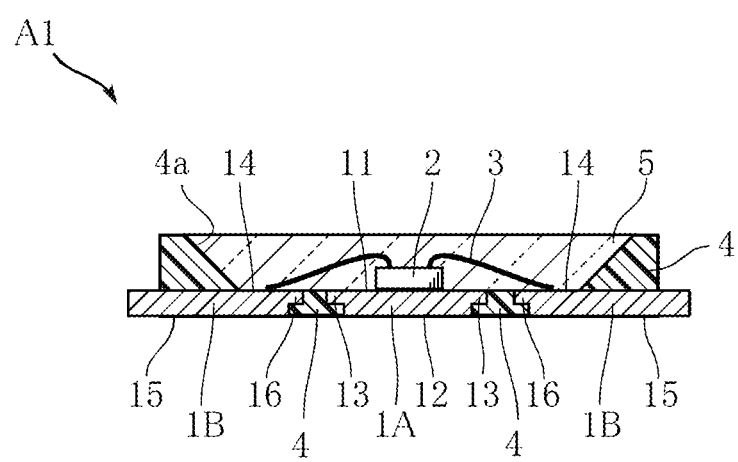
FIG. 3 is a sectional view taken along lines III-III in FIG. 1.
Figure 4:
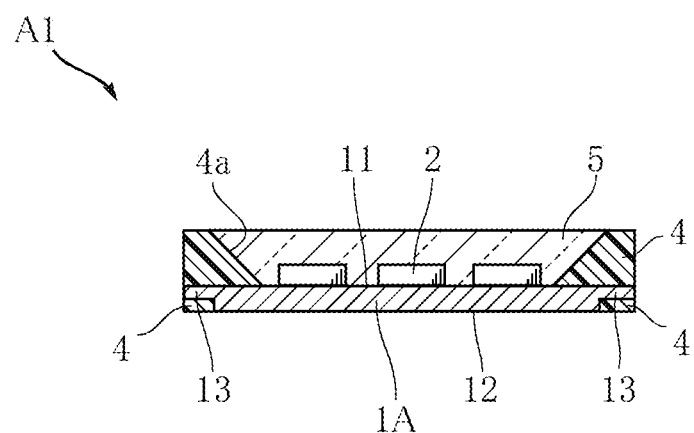
FIG. 4 is a sectional view taken along lines IV-IV in FIG. 1.

The leads 1A and 1B serve to support the LED chips 2 and supply electric power to the LED chips 2. For instance, the leads 1A and 1B are made of Cu, a Cu alloy or an Fe—Ni alloy and have a thickness of about 0.1 mm. The lead 1A includes a die bonding pad 11, an exposed surface 12 and a thin edge portion 13. The die bonding pad 11 is generally in the form of a strip. The LED chips 2 are bonded to the die bonding pad 11. As illustrated in FIG. 2, the exposed surface 12 is positioned on the opposite side of the die bonding pad 11 and exposed to the outside of the resin package 4. The four sides of the exposed surface 12 are surrounded by the resin package 4. As illustrated in FIGS. 3 and 4, the thin edge portion 13 surrounds the die bonding pad 11. The thin edge portion 13 is flush with the die bonding pad 11 and is not exposed on the exposed surface 12 side.

Each of the leads 1B includes a wire bonding pad 14, a terminal 15 and a thin edge portion 16. A wire 3 is bonded to the wire bonding pad 14. The terminal 15 is a surface on the opposite side of the wire bonding pad 14 and exposed to the outside of the resin package 4, as illustrated in FIG. 2. As illustrated in FIG. 3, the thin edge portion 16 extends from the wire bonding pad 14 and is not exposed on the terminal 15 side.

The LED chip 2 is the light source of the semiconductor-light emitting device A1. For instance, the LED chip 2 has a laminated structure made up of an n-type semiconductor layer, a p-type semiconductor layer and an active layer sandwiched between these semiconductor layers. In this embodiment, three LED chips 2 are mounted. For instance, the three LED chips 2 emit red light, green light and blue light, respectively.

The resin package 4 is made of e.g. white resin and partially covers each of the leads 1A, 1B. The resin package 4 includes an inwardly inclined surface 4a surrounding the three LED chips 2. The inwardly inclined surface 4a functions as a reflector for reflecting the light emitted laterally from the LED chips 2 toward the outside of the semiconductor light emitting device A1. For instance, the resin package 4 is molded as one piece by injecting molten resin into a mold in which the leads 1A and 1B are set.

The sealing resin 5 protects the LED chips 2 and the wires 3. The sealing resin 5 is loaded to fill the space surrounded by the inwardly inclined surface 4a. The sealing resin 5 is made of e.g. an epoxy resin permeable to the light emitted from the LED chips 2.

The advantages of the semiconductor light emitting device A1 will be described below.

According to the first embodiment, the heat from the LED chips 2 efficiently escapes through the exposed surface 12 to e.g. a circuit board on which the semiconductor light emitting device A1 is mounted. This makes it possible to increase the brightness of the semiconductor light emitting device A1.

Further, the lead 1A is surrounded by the resin package 4 from the four sides and does not extend to reach the edge of the resin package 4. Herein, to increase the brightness, it is desirable to arrange the LED chips 2 at the center of the semiconductor light emitting device A1. Thus, with the arrangement of the first embodiment, the lead 1A can have the smallest possible size which allows the proper mounting of the LED chips 2. This is desirable for the size reduction of the semiconductor light emitting device A1.

By mounting the three LED chips 2 on the die bonding pad 11, the LED chips 2 are arranged close to each other. This is suitable for promoting the mixing of light emitted from the three LED chips 2.

The provision of the thin edge portions 13 and 16 prevents the leads 1A and 1B from dropping from the resin package 4.

Figure 5:
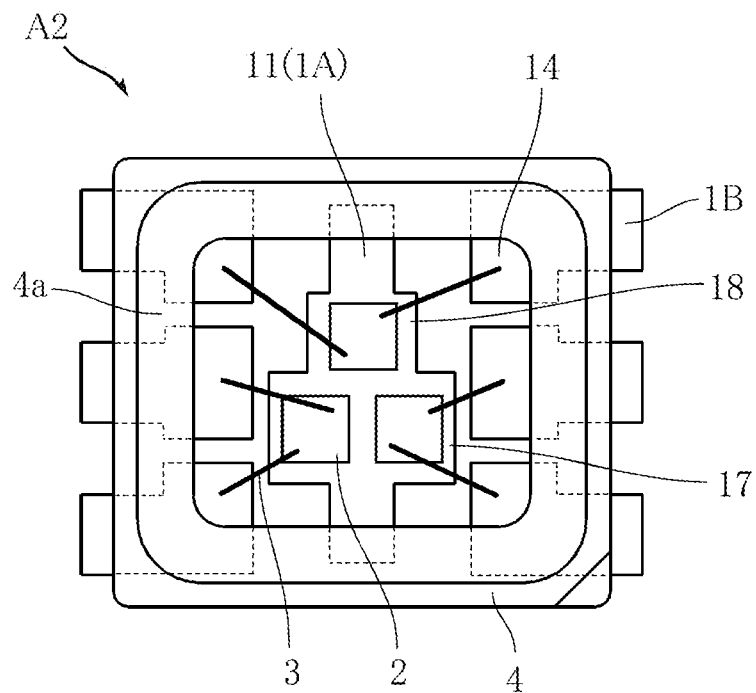
FIG. 5 is a top plan view illustrating a semiconductor light emitting device according to a second embodiment of the present invention.
Figure 6:
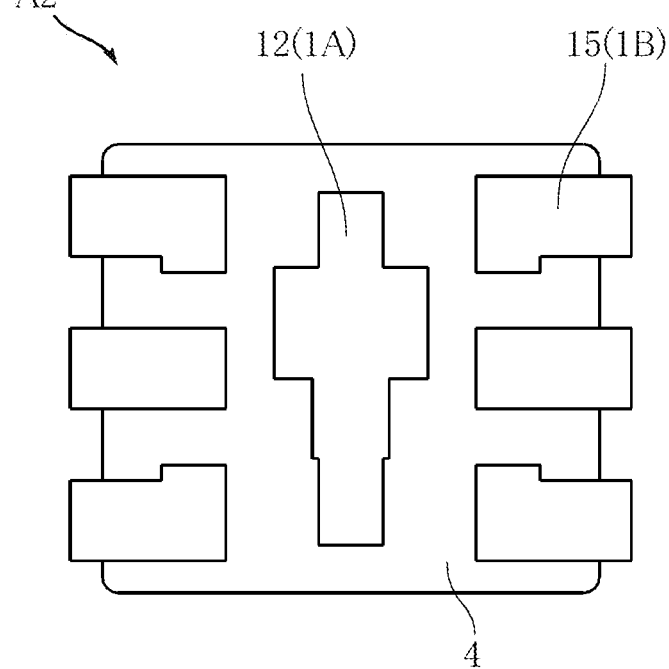
FIG. 6 is a bottom plan view illustrating the semiconductor light emitting device according to the second embodiment of the present invention.

FIGS. 5 and 6 illustrate a semiconductor light emitting device according to a second embodiment of the present invention. The semiconductor light emitting device A2 of the second embodiment differs from that of the first embodiment in shape of the die bonding pad 11 (lead 1A). In these figures, the elements which are identical or similar to those of the first embodiment are designated by the same reference signs as those used for the first embodiment.

As illustrated in FIG. 5, in the second embodiment, the width of the die bonding pad 11 changes stepwise in the longitudinal direction. Specifically, the die bonding pad 11 includes a relatively wide portion 17 on which two LED chips 2 are bonded and a relatively narrow portion 18 on which one LED chip 2 is bonded. In this embodiment, the three LED chips 2 can be arranged at the vertices of a triangle. This arrangement is desirable for the mixing of light emitted from the three LED chips 2.

Figure 7:
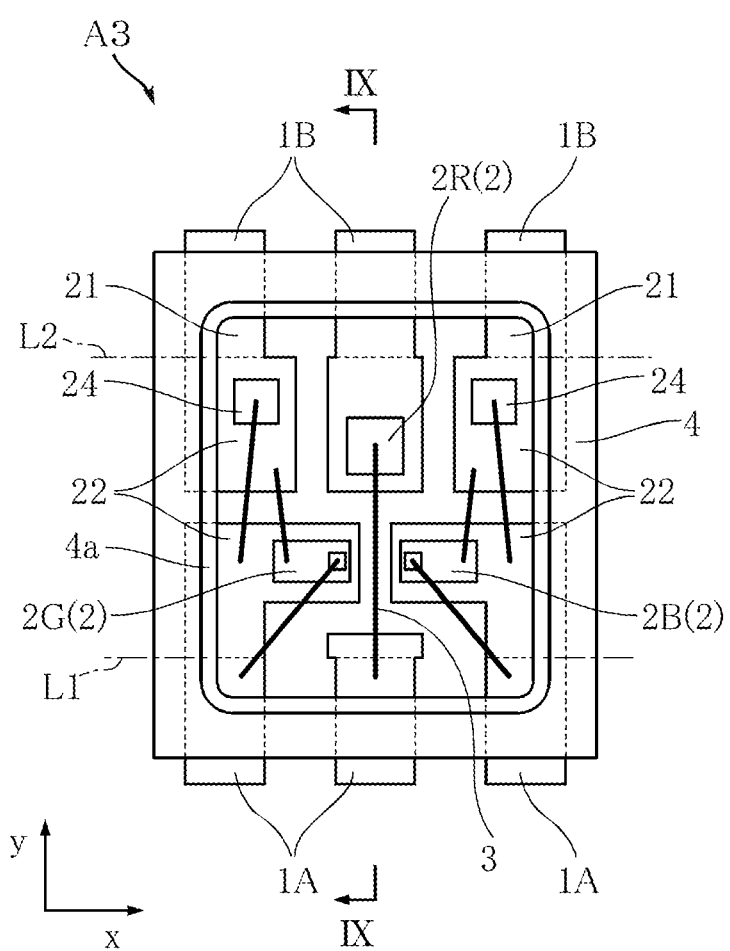
FIG. 7 is a top plan view illustrating a semiconductor light emitting device according to a third embodiment of the present invention.
Figure 8:
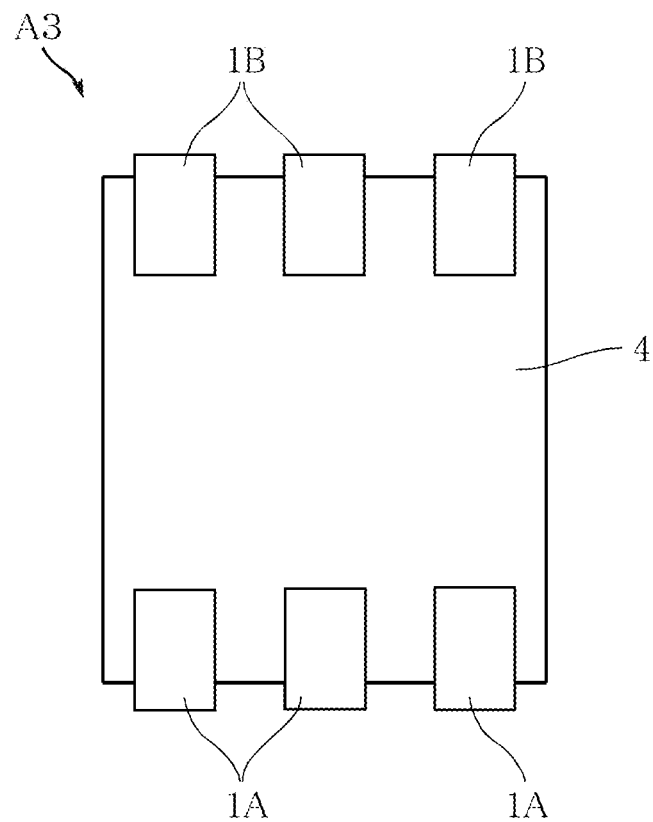
FIG. 8 is a bottom plan view illustrating the semiconductor light emitting device according to the third embodiment of the present invention.
Figure 9:
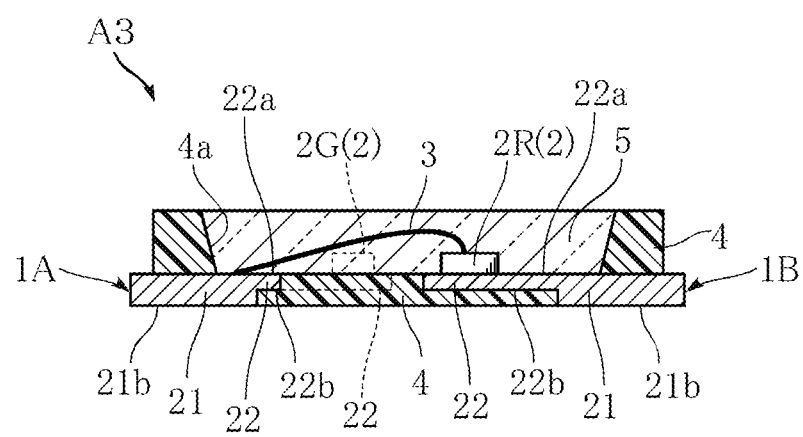
FIG. 9 is a sectional view taken along lines IX-IX in FIG. 7.

FIGS. 7-9 illustrate a semiconductor light emitting device according to a third embodiment of the present invention. In these figures, the elements which are identical or similar to those of the foregoing embodiments are designated by the same reference signs as those used for the foregoing embodiments. In the third embodiment, the horizontal direction in FIG. 7 is defined as the X direction, whereas the direction perpendicular to the X direction is defined as the Y direction.

As noted before, each of the semiconductor light emitting devices A1 and A2 of the first and the second embodiments includes a single lead 1A and a plurality of leads 1B. Unlike this, the semiconductor light emitting device A3 of the third embodiment includes a plurality of pairs of leads 1A and 1B. Specifically, as illustrated in FIG. 7, three leads 1A and three leads 1B are arranged to be spaced from each other in the Y direction to make three pairs of leads 1A and 1B spaced from each other in the X direction.

As illustrated in FIG. 9, each of the leads 1A and 1B is in the form of a plate comprising a thick portion 21 having a relatively large thickness and a thin portion 22 having a relatively small thickness which are connected to each other in the Y direction. The thin portion 22 has an upper surface 22a which is flush with the upper surface of the thick portion 21 and a retreated lower surface 22b. The thick portion 21 has a lower surface 21b exposed to the outside of the resin package 4. The lower surface 21b serves as a terminal for mounting the semiconductor light emitting device A3 onto a non-illustrated circuit board. The lower surface 22b of the thin portion 22 is covered with the resin package 4. The thick portion 21 has a thickness of about 0.15 mm, whereas the thin portion 22 has a thickness of about 0.1 mm.

As illustrated in FIG. 7, the boundary between the thick portion 21 and the thin portion 22 of each lead 1A is positioned on the straight line L1 extending in the X direction. The boundary between the thick portion 21 and the thin portion 22 of each lead 1B is positioned on the straight line L2 extending in the X direction. The leads 1A and 1B including the thin portions 22 can be formed by e.g. press working.

Figure 10A:
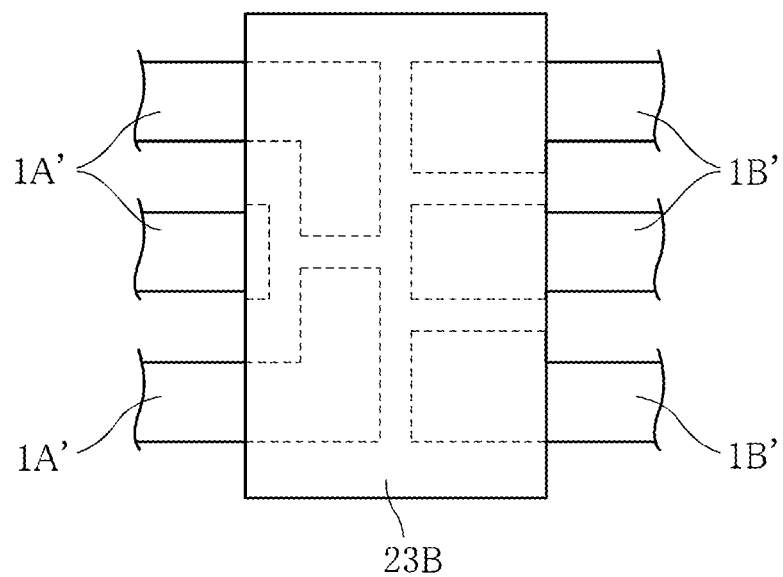
FIG. 10A is a top plan view illustrating a step of the process for making a thin portion.
Figure 10B:
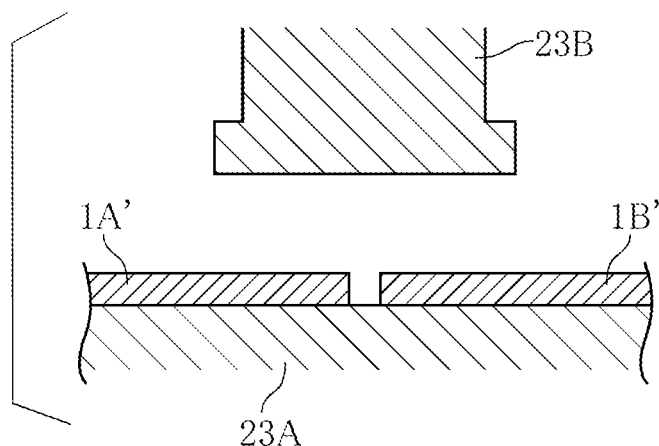
FIG. 10B is a sectional view for illustrating the step depicted in FIG. 10A.
Figure 10C:
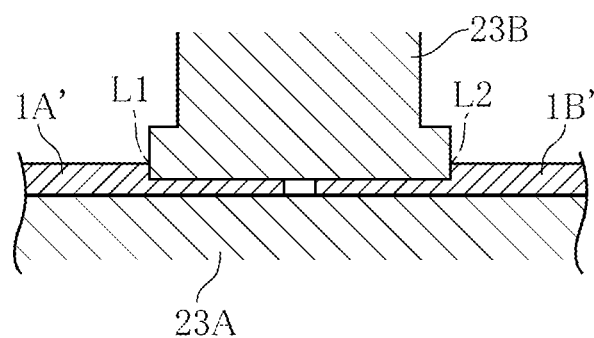
FIG. 10C is a sectional view illustrating another step of the process.

The process for making a thin portion 22 will be described below with reference to FIGS. 10A-10C. First, as illustrated in FIGS. 10A and 10B, metal plates 1A' and 1B' of a uniform thickness are set between a mold member 23A for backup and a mold member 23B for pressing. The pressing portion of the mold member 23B is rectangular in plan, as seen from FIG. 10A. Though not depicted, the metal plates 1A' and 1B' are integrally connected to each other via e.g. a lead frame. Then, as illustrated in FIG. 10C, the mold member 23B is lowered to press predetermined parts of the respective metal plates 1A' and 1B'. In each of the metal plates 1A' and 1B, the pressed part is formed into a thin portion 22. In this way, the leads 1A and 1B including thin portions 22 are made collectively by performing a single pressing step with respect to the metal plates 1A' and 1B'. In the leads 1A and 1B, the boundary between the thin portion 11 and the thick portion 12 corresponds to the edge of the molding member 23B.

The three LED chips 2 in the third embodiment may include LED chips 2R, 2G and 2B for emitting red light, green light and blue light, respectively. As illustrated in FIG. 9, the LED chips 2 are mounted individually on the upper surfaces 22a of the thin portions 22 of the leads 1A, 1B. A wire 3 is bonded, at one end, to each of the LED chips 2. The other end of each wire 3 is bonded to the lead 1B (1A) which is paired, in the Y direction, with the lead 1A (1B) on which the LED chip 2 is mounted.

In the third embodiment, the LED chip 2R has a double-sided electrode structure in which a pair of electrodes are formed on the two main surfaces. The LED chip 2R is bonded to the lead 1B located in the middle in the X direction. The LED chips 2G and 2B has a single-sided electrode structure in which a pair of electrodes are collectively formed on one main surface. The LED chips 2G and 2B are bonded to the leads 1A located on the two sides in the X direction. Two zener diodes 24 connected in parallel to be in reverse bias from the LED chips 2G, 2B are mounted on the leads 1B located on the two sides in the X direction. With this arrangement, excessive current is prevented from flowing through the LED chips 2G and 2B.

The advantages of the semiconductor light emitting device A3 will be described below.

According to the third embodiment, the heat generated from the LED chips 2 efficiently escapes through the exposed surfaces of the leads 1A and 1B (the lower surfaces 21b of the thick portions 21) to e.g. a circuit board on which the semiconductor light emitting device A3 is mounted. Further, as noted before, the leads 1A and 1B include thin portions 22, and the lower surfaces 22b of the thin portions 22 are covered with the resin package 4. With this arrangement, even when the entire thickness of the leads 1A and 1B is reduced to reduce the size of the semiconductor light emitting device A3, the leads 1A and 1B do not drop from the resin package 4, because the thin portions 22 engage the resin package 4. Thus, the size reduction (thickness reduction) of the semiconductor light emitting device A3 is achieved.

In the third embodiment, the thin portions 22 of the leads 1A and 1B are formed collectively by pressing using a rectangular mold member 23B. Thus, the thin portions 22 are formed easily, and the dimension of the thin portion 22 does not vary. This is desirable for reducing the size of the semiconductor light emitting device A3.

Figure 11:
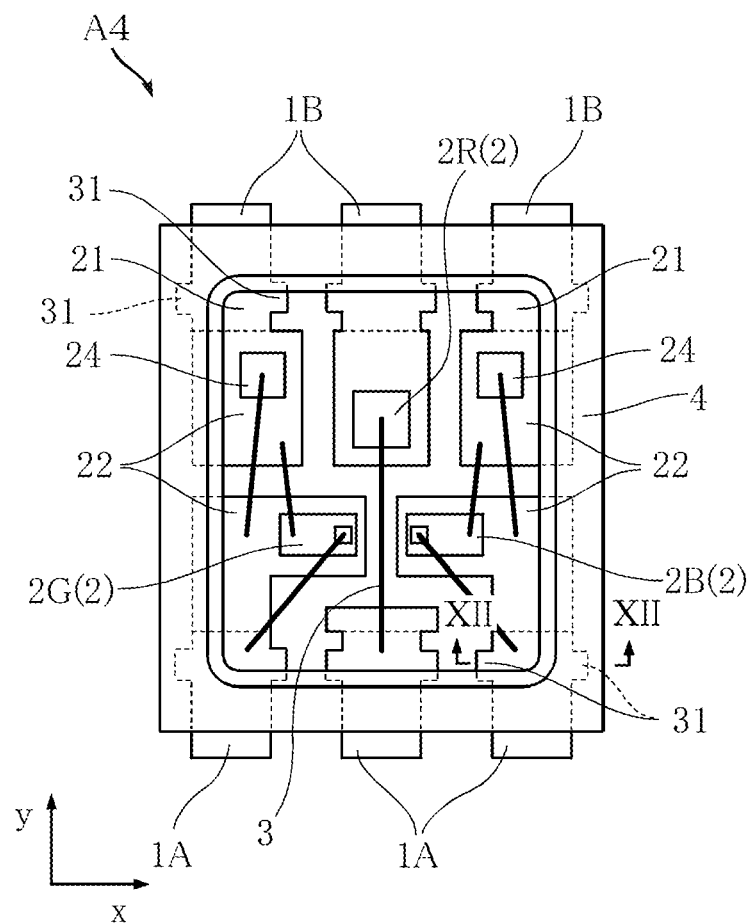
FIG. 11 is a top plan view illustrating a semiconductor light emitting device according to a fourth embodiment of the present invention.
Figure 12:
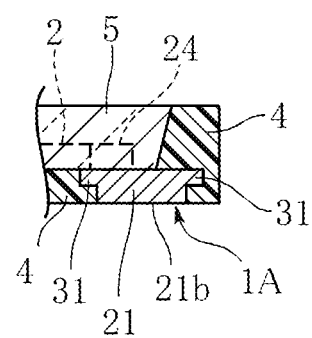
FIG. 12 is a sectional view taken along lines XII-XII in FIG. 11.
Figure 13:
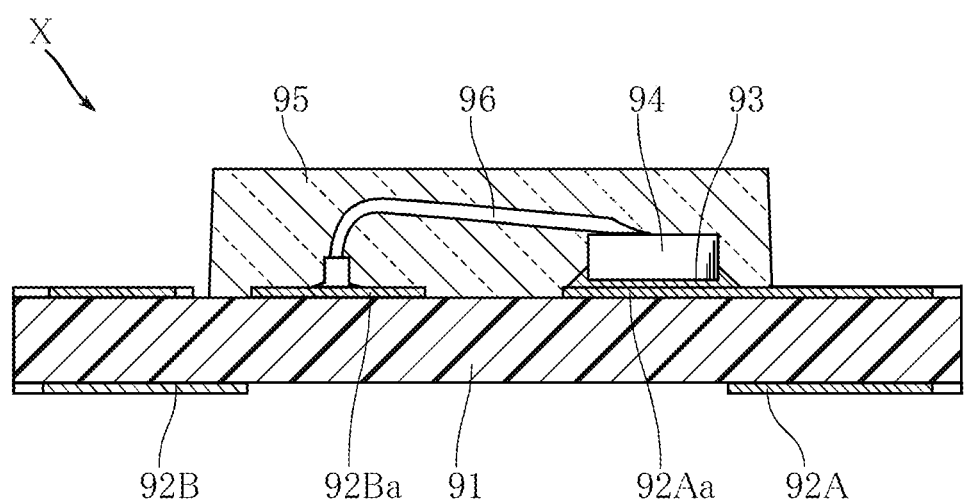
FIG. 13 is a sectional view illustrating a conventional semiconductor light emitting device.

FIGS. 11 and 12 illustrate a semiconductor light emitting device according to a fourth embodiment of the present invention. The semiconductor light emitting device A4 of the fourth embodiment differs from the semiconductor light emitting device A3 of the third embodiment in that the leads 1A and 1B are formed with projections 31. In these figures, the elements which are identical or similar to those of the foregoing embodiments are designated by the same reference signs as those used for the foregoing embodiments.

As illustrated in FIG. 11, in the fourth embodiment, the thick portion 21 of each lead 1A, 1B is formed with a plurality of projections 31 projecting in a direction perpendicular to the thickness direction of the thick portion 21 at the surface contacting the resin package 4. Each of the projections 31 is generally rectangular in plan view. Each of the projections 31 is equal in thickness to the thin portion 12 and is not exposed at the reverse surface of the semiconductor light emitting device A4.

According to the fourth embodiment, the provision of the projections 31 at the thick portions 21 of the leads 1A and 1B substantially increases the surface area of the leads 1A and 1B. As a result the contact area between the leads 1A, 1B and the resin package 4 increases, which achieves reliable adhesion of the leads 1A, 1B to the resin package 4. This arrangement more effectively prevents the leads 1A and 1B from dropping from the resin package 4.

As another technique to enhance the adhesion of the leads 1A, 1B to the resin package 4, when the leads 1A and 1B are made of a material other than Cu, the surfaces of the leads 1A and 1B may be plated with Cu, which has a high affinity for the resin package 4, except the portions to which the LED chips or wires are to be bonded. As still another technique, shot blasting may be performed with respect to the surfaces of the leads 1A and 1B except the portions to which the LED chips or wires are to be bonded to form minute projections and recesses at the surfaces. These techniques may be employed in combination as required.

The semiconductor light emitting device of the present invention is not limited to the foregoing embodiments. The specific structure of the semiconductor light emitting device according to the present invention may be varied in design in many ways.

For instance, the semiconductor light emitting device of the present invention does not necessarily need to include three LED chips for emitting red light, green light and blue light. The semiconductor light emitting device may include an LED chip for emitting blue light and a sealing resin in which a fluorescent material is mixed. In this case, the semiconductor light emitting device emits white light. Alternatively, the semiconductor light emitting device may include three LED chips for emitting light of the same color (e.g. blue light). When the LED chips emit light of the same color, the brightness of the semiconductor light emitting device is enhanced.

In the third embodiment, the LED chips 2 are mounted on the thin portion 22 of the leads 1A and 1B. Alternatively, the LED chips 2 may be mounted on both the thin portion 22 and the thick portion 21, or on the thick portion 21 only.

The invention claimed is:

1. A semiconductor light emitting device comprising:
   a first lead including a first thick portion and a first thin portion that is smaller in thickness than the first thick portion;
   a second lead spaced apart from the first lead in a first direction, the second lead including a second thick portion and a second thin portion that is smaller in thickness than the second thick portion;
   at least one semiconductor light source bonded on the first thick portion of the first lead, one of the at least one semiconductor light source being electrically connected to the second lead;
   a resin package supporting the first lead and the second lead, the resin package including an inclined surface that surrounds the at least one semiconductor light source in plan view; and
   a sealing resin disposed in a space defined by the inclined surface of the resin package, the sealing resin covering the at least one semiconductor light source,
   wherein the first thick portion, the first thin portion, the second thick portion, and the second thin portion each include an obverse surface and a reverse surface,
   the reverse surfaces of the first thick portion and the second thick portion are exposed from the resin package,
   the reverse surfaces of the thirst thin portion and the second thin portion are covered by the resin package,
   the resin package is in contact with the obverse surfaces of the first thick portion and the second thick portion,
   the resin package has at least one straight edge in plan view, and
   the at least one straight edge of the resin package comprises an inner straight edge extending to cross the first thick portion in plan view.

2. The semiconductor light emitting device according to claim 1, wherein the at least one straight edge of the resin package comprises an outer straight edge from which a part of the second lead protrudes outward in plan view.

3. The semiconductor light emitting device according to claim 1, wherein the resin package overlaps with the first lead in plan view.

4. The semiconductor light emitting device according to claim 1, wherein the resin package overlaps with the second thick portion of the second lead in plan view.

5. The semiconductor light emitting device according to claim 1, wherein the resin package includes a side surface, and at least a part of the first thin portion is exposed from the side surface of the resin package.

6. The semiconductor light emitting device according to claim 1, wherein the reverse surface of the first thick portion has a first linear edge and a second linear edge that extend in different directions and that are exposed from the resin package.

7. The semiconductor light emitting device according to claim 1, wherein an entirety of the reverse surface of the first thick portion is surrounded by the resin package in rear view.

8. The semiconductor light emitting device according to claim 1, wherein the obverse surfaces of the first thick portion, the first thin portion, the second thick portion, and the second thin portion are flush with each other.

9. The semiconductor light emitting device according to claim 1, wherein the at least one semiconductor light source comprises a plurality of semiconductor chips arranged in a row perpendicular to the first direction.

10. The semiconductor light emitting device according to claim 1, wherein the sealing resin comprises a flat light-emitting surface.

11. The semiconductor light emitting device according to claim 1, further comprising a wire connecting said one of the at least one semiconductor light source to the second lead, wherein an end of the wire is bonded to the obverse surface of the second thick portion.

12. A semiconductor light emitting device, comprising:
    a first lead including a first thick portion and a first thin portion that is smaller in thickness than the first thick portion;
    a second lead spaced apart from the first lead in a first direction, the second lead including a second thick portion and a second thin portion that is smaller in thickness than the second thick portion;
    at least one semiconductor light source bonded on the first thick portion of the first lead, one of the at least one semiconductor light source being electrically connected to the second lead;
    a resin package supporting the first lead and the second lead, the resin package including an inclined surface that surrounds the at least one semiconductor light source in plan view; and
    a sealing resin disposed in a space defined by the inclined surface of the resin package, the sealing resin covering the at least one semiconductor light source,
    wherein the first thick portion, the first thin portion, the second thick portion, and the second thin portion each include an obverse surface and a reverse surface,
    the reverse surfaces of the first thick portion and the second thick portion are exposed from the resin package,
    the reverse surfaces of the thirst thin portion and the second thin portion are covered by the resin package,
    the resin package is in contact with the obverse surfaces of the first thick portion and the second thick portion, and
    a combination of the sealing resin and the resin package is in contact with an entirety of the obverse surface of the second thin portion.

13. The semiconductor light emitting device according to claim 12, wherein the resin package is out of contact with a part of the obverse surface of the second thin portion.

14. The semiconductor light emitting device according to claim 12, wherein the resin package is in contact with the obverse surface of the first thin portion.

15. The semiconductor light emitting device according to claim 12, wherein the resin package overlaps with the first lead in plan view.

16. The semiconductor light emitting device according to claim 12, wherein the resin package overlaps with the second thick portion of the second lead in plan view.

17. The semiconductor light emitting device according to claim 12, wherein the resin package includes a side surface, and at least a part of the first thin portion is exposed from the side surface of the resin package.

18. The semiconductor light emitting device according to claim 12, wherein the reverse surface of the first thick portion has a first linear edge and a second linear edge that extend in different directions and that are exposed from the resin package.

19. The semiconductor light emitting device according to claim 12, wherein an entirety of the reverse surface of the first thick portion is surrounded by the resin package in rear view.

20. The semiconductor light emitting device according to claim 12, wherein the obverse surfaces of the first thick portion, the first thin portion, the second thick portion, and the second thin portion are flush with each other.

21. The semiconductor light emitting device according to claim 12, wherein the at least one semiconductor light source comprises a plurality of semiconductor chips arranged in a row perpendicular to the first direction.

22. The semiconductor light emitting device according to claim 12, wherein the sealing resin comprises a flat light-emitting surface.

23. The semiconductor light emitting device according to claim 12, further comprising a wire connecting said one of the at least one semiconductor light source to the second lead, wherein an end of the wire is bonded to the obverse surface of the second thick portion.

24. A semiconductor light emitting device, comprising:
a first lead including a first thick portion and a first thin portion that is smaller in thickness than the first thick portion;
a second lead spaced apart from the first lead in a first direction, the second lead including a second thick portion and a second thin portion that is smaller in thickness than the second thick portion;
at least one semiconductor light source bonded on the first thick portion of the first lead, one of the at least one semiconductor light source being electrically connected to the second lead;
a resin package supporting the first lead and the second lead, the resin package including an inclined surface that surrounds the at least one semiconductor light source in plan view; and
a sealing resin disposed in a space defined by the inclined surface of the resin package, the sealing resin covering the at least one semiconductor light source,
wherein the first thick portion, the first thin portion, the second thick portion, and the second thin portion each include an obverse surface and a reverse surface,
the reverse surfaces of the first thick portion and the second thick portion are exposed from the resin package,
the reverse surfaces of the thirst thin portion and the second thin portion are covered by the resin package,
the resin package is in contact with the obverse surfaces of the first thick portion and the second thick portion,
the obverse surface of the first lead has a non-rectangular shape, and
the obverse surface of the first lead comprises a generally straight edge formed with a plurality of recesses spaced apart from each other along an entire length of the generally straight edge.

25. The semiconductor light emitting device according to claim 1, wherein the resin package is in contact with the obverse surface of the first thin portion.

26. The semiconductor light emitting device according to claim 24, wherein the resin package is in contact with the obverse surface of the first thin portion.

27. The semiconductor light emitting device according to claim 24, wherein the resin package overlaps with the first lead in plan view.

28. The semiconductor light emitting device according to claim 24, wherein the resin package overlaps with the second thick portion of the second lead in plan view.

29. The semiconductor light emitting device according to claim 24, wherein the resin package includes a side surface, and at least a part of the first thin portion is exposed from the side surface of the resin package.

30. The semiconductor light emitting device according to claim 24, wherein the reverse surface of the first thick portion has a first linear edge and a second linear edge that extend in different directions and that are exposed from the resin package.

31. The semiconductor light emitting device according to claim 24, wherein an entirety of the reverse surface of the first thick portion is surrounded by the resin package in rear view.

32. The semiconductor light emitting device according to claim 24, wherein the obverse surfaces of the first thick portion, the first thin portion, the second thick portion, and the second thin portion are flush with each other.

33. The semiconductor light emitting device according to claim 24, wherein the at least one semiconductor light source comprises a plurality of semiconductor chips arranged in a row perpendicular to the first direction.

34. The semiconductor light emitting device according to claim 24, wherein the sealing resin comprises a flat light-emitting surface.

35. The semiconductor light emitting device according to claim 24, further comprising a wire connecting said one of the at least one semiconductor light source to the second lead, wherein an end of the wire is bonded to the obverse surface of the second thick portion.

36. A semiconductor light emitting device, comprising:
a first lead including a first thick portion and a first thin portion that is smaller in thickness than the first thick portion;
a second lead spaced apart from the first lead in a first direction, the second lead including a second thick portion and a second thin portion that is smaller in thickness than the second thick portion;
at least one semiconductor light source bonded on the first thick portion of the first lead, one of the at least one semiconductor light source being electrically connected to the second lead;
a resin package supporting the first lead and the second lead, the resin package including an inclined surface that surrounds the at least one semiconductor light source in plan view; and
a sealing resin disposed in a space defined by the inclined surface of the resin package, the sealing resin covering the at least one semiconductor light source,
wherein the first thick portion, the first thin portion, the second thick portion, and the second thin portion each include an obverse surface and a reverse surface, the reverse surfaces of the first thick portion and the second thick portion are exposed from the resin package, the reverse surfaces of the thirst thin portion and the second thin portion are covered by the resin package, the resin package is in contact with the obverse surfaces of the first thick portion and the second thick portion, and wherein the resin package is out of contact with a part of the obverse surface of the second thin portion.

37. The semiconductor light emitting device according to claim 36, wherein the obverse surface of the second thin portion comprises: an inner area exposed to the space defined by the inclined surface of the resin package; and a remaining area other than the inner area, wherein an entirety of the remaining area is in contact with the resin package.

38. The semiconductor light emitting device according to claim 36, wherein the resin package is in contact with the obverse surface of the first thin portion.

39. The semiconductor light emitting device according to claim 36, wherein the resin package overlaps with the first lead in plan view.

40. The semiconductor light emitting device according to claim 36, wherein the resin package overlaps with the second thick portion of the second lead in plan view.

41. The semiconductor light emitting device according to claim 36, wherein the resin package includes a side surface, and at least a part of the first thin portion is exposed from the side surface of the resin package.

42. The semiconductor light emitting device according to claim 36, wherein the reverse surface of the first thick portion has a first linear edge and a second linear edge that extend in different directions and that are exposed from the resin package.

43. The semiconductor light emitting device according to claim 36, wherein an entirety of the reverse surface of the first thick portion is surrounded by the resin package in rear view.

44. The semiconductor light emitting device according to claim 36, wherein the obverse surfaces of the first thick portion, the first thin portion, the second thick portion, and the second thin portion are flush with each other.

45. The semiconductor light emitting device according to claim 36, wherein the at least one semiconductor light source comprises a plurality of semiconductor chips arranged in a row perpendicular to the first direction.

46. The semiconductor light emitting device according to claim 36, wherein the sealing resin comprises a flat light-emitting surface.

47. The semiconductor light emitting device according to claim 36, further comprising a wire connecting said one of the at least one semiconductor light source to the second lead, wherein an end of the wire is bonded to the obverse surface of the second thick portion.

* * * * *